(12) United States Patent
Berkenbush et al.

(10) Patent No.: US 7,336,493 B2
(45) Date of Patent: Feb. 26, 2008

(54) COLD PLATE COOLING APPARATUS FOR A RACK MOUNTED ELECTRONIC MODULE

(75) Inventors: Richard E. Berkenbush, Pompton Plains, NJ (US); Donald W. Gattoni, Allendale, NJ (US); Santosh Kumar, Morris Plains, NJ (US); Edward D. O'Neill, Totowa, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 203 days.

(21) Appl. No.: 11/184,153

(22) Filed: Jul. 19, 2005

(65) Prior Publication Data

US 2007/0019384 A1 Jan. 25, 2007

(51) Int. Cl.
*H05K 7/20* (2006.01)
*F28F 7/00* (2006.01)
*F16B 2/14* (2006.01)

(52) U.S. Cl. ............ 361/711; 361/702; 165/80.2; 403/409.1

(58) Field of Classification Search ............... 361/687, 361/690–695, 699, 702, 703, 711, 720, 724–728, 361/736, 752, 753, 759, 796–803, 816, 818, 361/831; 165/122–126, 80.2, 80.3, 80.4, 165/104.33; 454/184; 174/15.1, 16.1; 403/409.1
See application file for complete search history.

(56) References Cited

U.S. PATENT DOCUMENTS 5,262,587 A * 11/1993 Moser .................... 174/15.1
6,665,184 B2 * 12/2003 Akselband ................ 361/699

* cited by examiner

*Primary Examiner*—Thao X. Le
*Assistant Examiner*—Anthony M Haughton
(74) *Attorney, Agent, or Firm*—David L. Davis (57) ABSTRACT

Apparatus which is capable of providing efficient cooling of rack mounted electronic modules while accommodating relatively large tolerances in the mounting of the modules. A plurality of thermally conductive sliding wedge blocks are interposed between the lower surface of each module and the upper surface of the cold plate base of the rack. The mechanism for clamping a module to the rack also pulls the wedge blocks together to fill in the gap between the lower surface of the module and the upper surface of the cold plate so as to provide a complete thermal path therebetween.

20 Claims, 7 Drawing Sheets

COLD PLATE COOLING APPARATUS FOR A RACK MOUNTED ELECTRONIC MODULE

STATEMENT OF GOVERNMENT INTEREST

This invention claimed in this patent application was made with U.S. Government support under contract no. W56HZV-05-C-0724 awarded by the US Army. The U.S. Government has certain rights in the invention.

BACKGROUND OF THE INVENTION

This invention relates to the cooling of rack mounted electronic modules and, more particularly, to apparatus which is capable of providing efficient cold plate cooling while accommodating relatively large tolerances in the mounting of the electronic modules.

In a high temperature thermal environment, convection cooling of rack mounted electronic modules may not provide sufficient cooling capacity. Liquid cooling through the use of a cold plate is one approach for providing the required cooling capacity. In this approach, the lower surface of each module must be maintained in heat transferring contact with the cold plate. However, with rack mounted electronic modules, there is a tolerance issue wherein the position of the lower surface of a module cannot be predicted with any certainty, due to the electronic module being positioned by a rack connector and the cold plate being fixed on the rack. It would therefore be desirable to have the cooling apparatus of the cold plate type for rack mounted electronic modules compensate for the resulting varying gap between the lower surfaces of the modules and the cold plate.

SUMMARY OF THE INVENTION

According to the present invention, a plurality of thermally conductive sliding wedge blocks are interposed between the lower surface of each module and the cold plate. The mechanism for clamping a module to the rack also pulls the wedge blocks together to fill in the gap between the lower surface of the module and the cold plate so as to complete the thermal path therebetween.

In accordance with an aspect of this invention, a smooth flat thermally conductive cover is positioned over the wedge blocks. The cover provides a smooth flat surface to slide the module into the rack and also protects the wedge blocks from dirt and debris.

In accordance with another aspect of this invention, the wedge blocks are pulled together by a long threaded rod which is threaded into the last wedge block and is part of the mechanism for clamping a module to the rack.

BRIEF DESCRIPTION OF THE DRAWINGS

The foregoing will be more readily apparent from reading the following description in conjunction with the drawings in which like elements in different figures thereof are identified by the same reference numeral and wherein.

DETAILED DESCRIPTION

Figure 1:
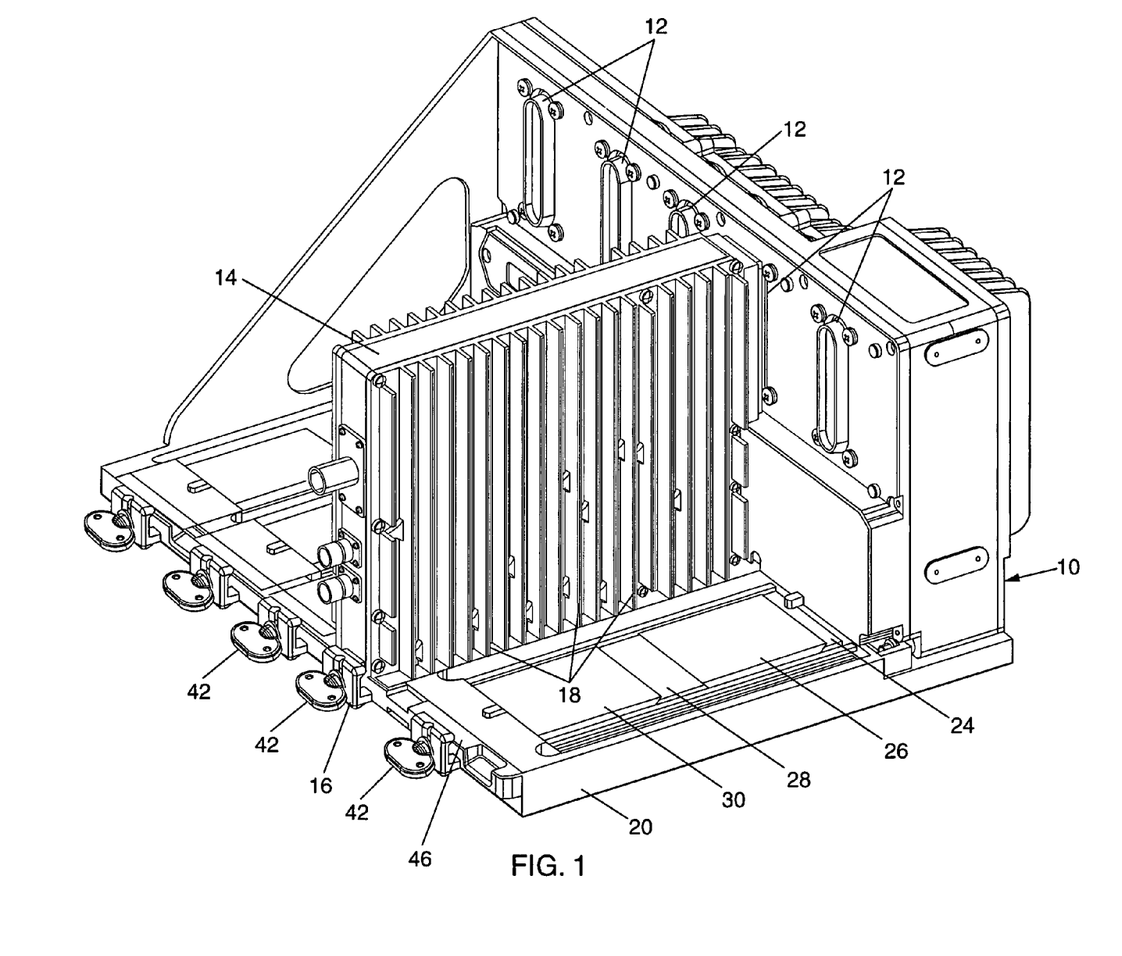
FIG. 1 is a top isometric view showing a rack incorporating exemplary structure according to the present invention, with a typical electronics module installed in one slot and the cover removed in another slot to expose the sliding wedge blocks in that slot.

Referring now to the drawings, FIG. 1 shows an illustrative embodiment of a rack, designated generally by the reference numeral 10 and including exemplary structure constructed in accordance with the principles of this invention, for mounting and electrically interconnecting electronics modules, each in a respective slot in the rack 10. The rack 10 is provided with an array of electrical connectors 12, one for each of the module slots, and a typical electronics module 14 is shown mounted in the rack 10 with its electrical connector (not shown) mated with one of the rack connectors 12. The module 14 is held in place at its rearward end by the connector 12 and at its forward end by the clamp mechanism 16. The foregoing is well known in the art.

Figure 2:
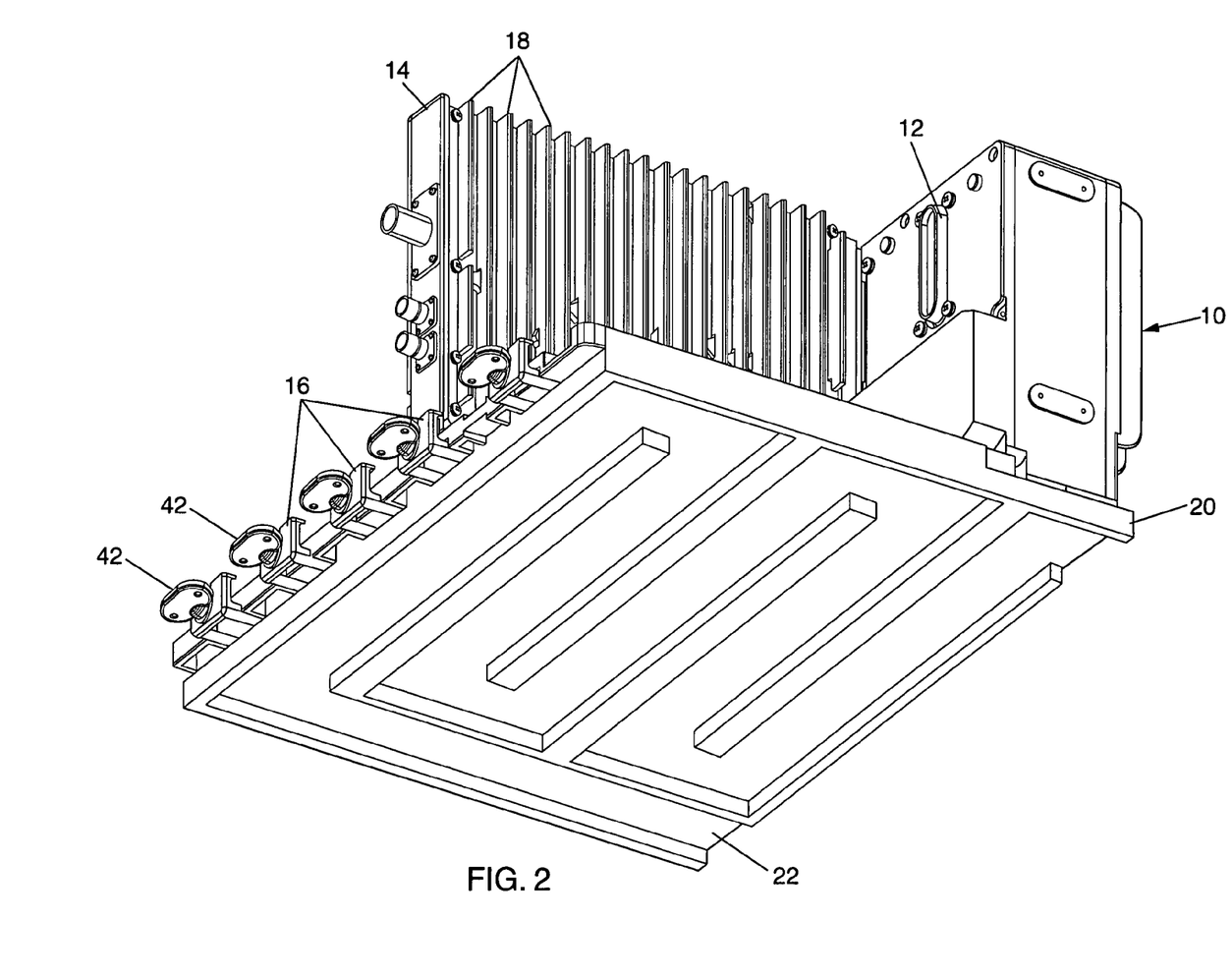
FIG. 2 is a bottom isometric view of the rack shown in FIG. 1 and illustrating a coolant path in the base of the rack.

If the module 14 does not get too warm, and if the environmental temperature is not too warm, convection cooling of the module 14 via the external conductive fins 18 may be sufficient. When convection cooling is not practical, cold plate cooling may be an appropriate alternative approach. For cold plate cooling, the base 20 of the rack 10 is formed of a thermally conductive material with a passageway 22 (FIG. 2) below a substantially planar upper surface to allow a liquid coolant to flow therethrough. Due to manufacturing tolerances in a conventional rack for holding electronic modules, the position of an individual connector 12 within its slot may be such that the lower substantially planar surface of the module 14 mated with that connector may not contact the upper planar surface of the base 20 of the rack 10 over a sufficient area, thereby not providing an efficient heat transfer path between the two. The present invention solves that problem by providing structure which fills in any gap between the two surfaces with a thermally conductive material to provide a reliable thermal interface.

Figure 7:
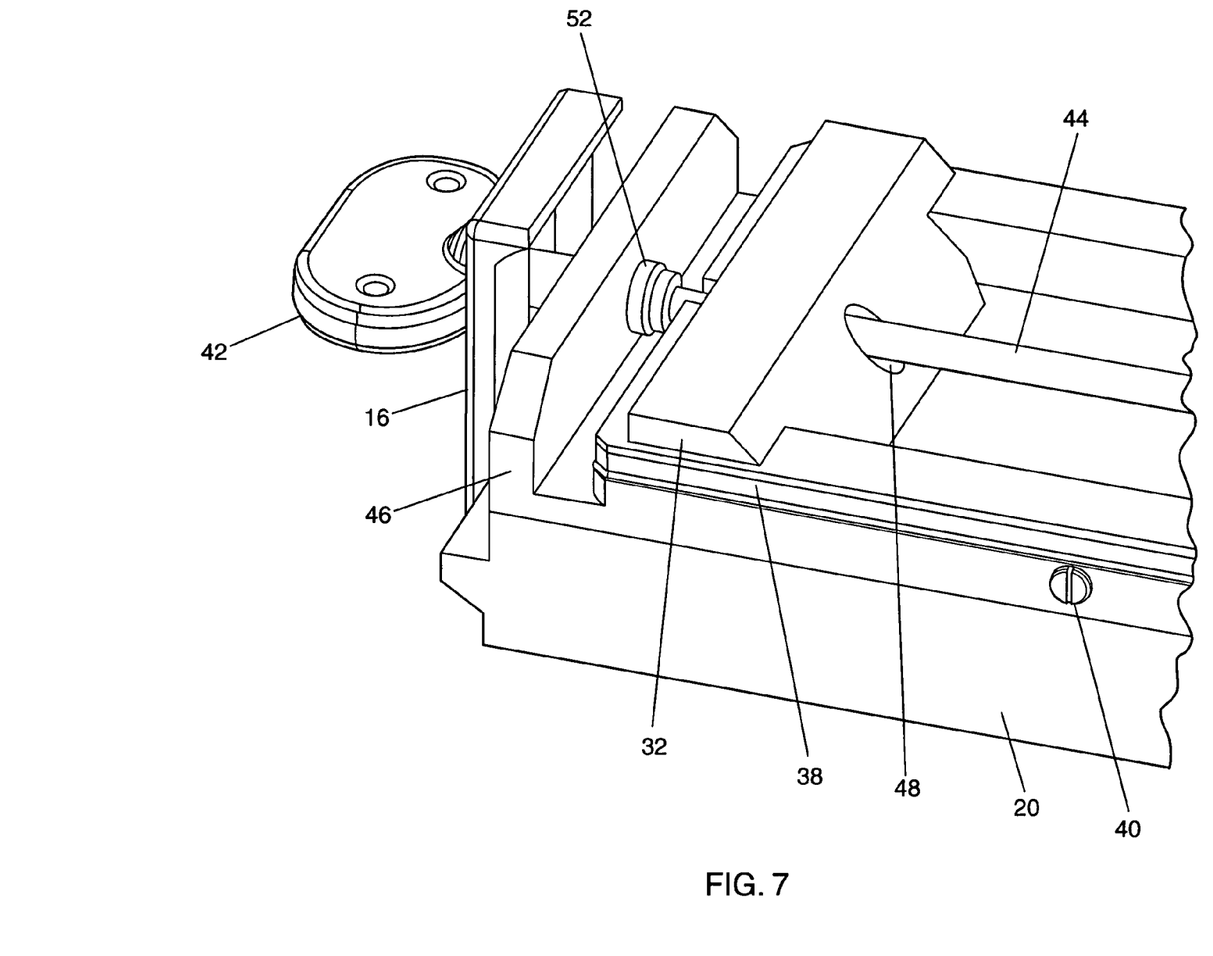
FIG. 7 is an enlarged view of the apparatus shown in FIG. 5 showing details in the vicinity of the front wedge block.

FIG. 1 illustrates, in the slot next to the module 14, an illustrative embodiment of the inventive structure without its cover in place. Thus, several thermally conductive sliding wedge blocks 24, 26, 28, 30, are in place between the upper surface of the base 20 (which acts as a cold plate) and the lower surface of a module 14 (the heat dissipater) which will be installed in that slot. In addition, the base 20 is formed at its end near the clamp mechanism 16 with what can be considered a fixed wedge block 32 (FIG. 7). (Note that the wedge block 32 can alternatively be a sliding wedge block.) As will become clear from the following discussion, the wedge blocks 24, 26, 28, 30, 32, have abutting sloped sides which cause alternate wedge blocks to move vertically relative to each other when the wedge blocks are subjected to a horizontal compressive force. Thus, alternate wedge blocks move up or down to insure good contact with the lower surface of a module or the upper surface of the cold plate, respectively, while maintaining good contact between adjacent wedge blocks so that an uninterrupted thermal path is provided between the lower surface of the module 14 and the upper surface of the cold plate 20.

Figure 3:
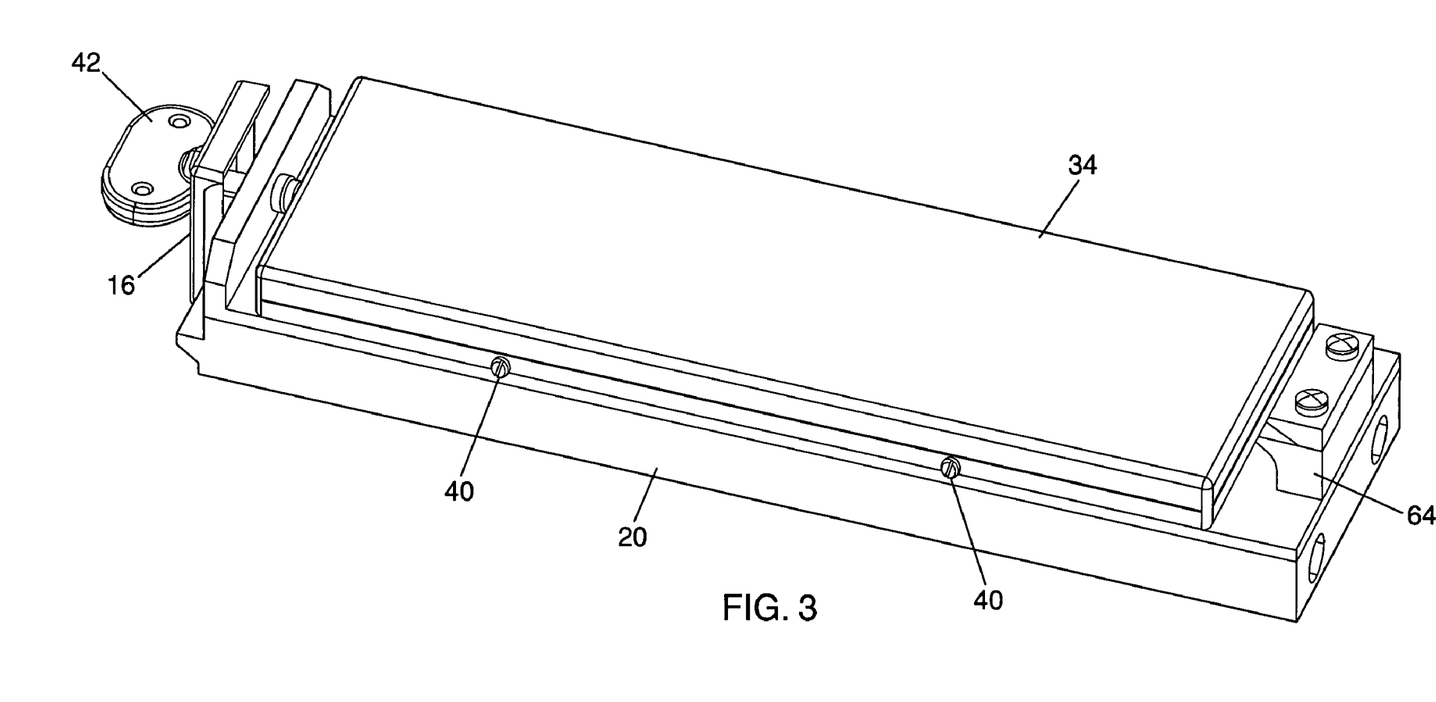
FIG. 3 is an isometric view showing a test fixture for a single module useful for verifying the operation of the inventive cooling apparatus.

FIG. 3 illustrates a single slot of a rack wherein a cover 34 overlies the wedge blocks 24, 26, 28, 30, 32. The cover 34 provides a smooth flat surface to slide the module 14 into the rack 10 and also protects the wedge blocks from dirt and debris. So that a thermal path is maintained between the base 20 and the module 14, the cover 34, like the wedge blocks, is formed of a thermally conductive material.

Figure 4:
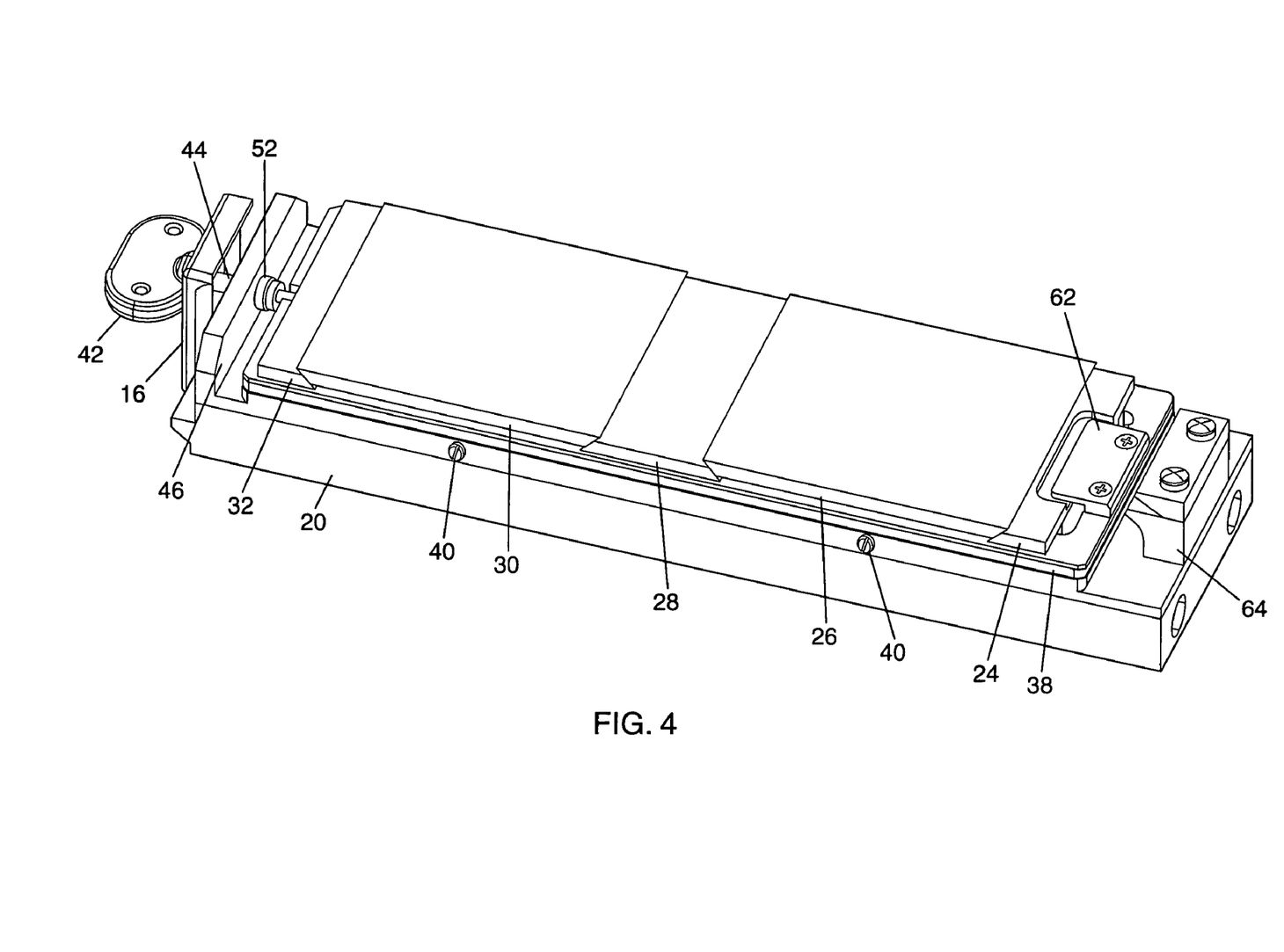
FIG. 4 is a view similar to FIG. 3 with the cover removed.
Figure 5:
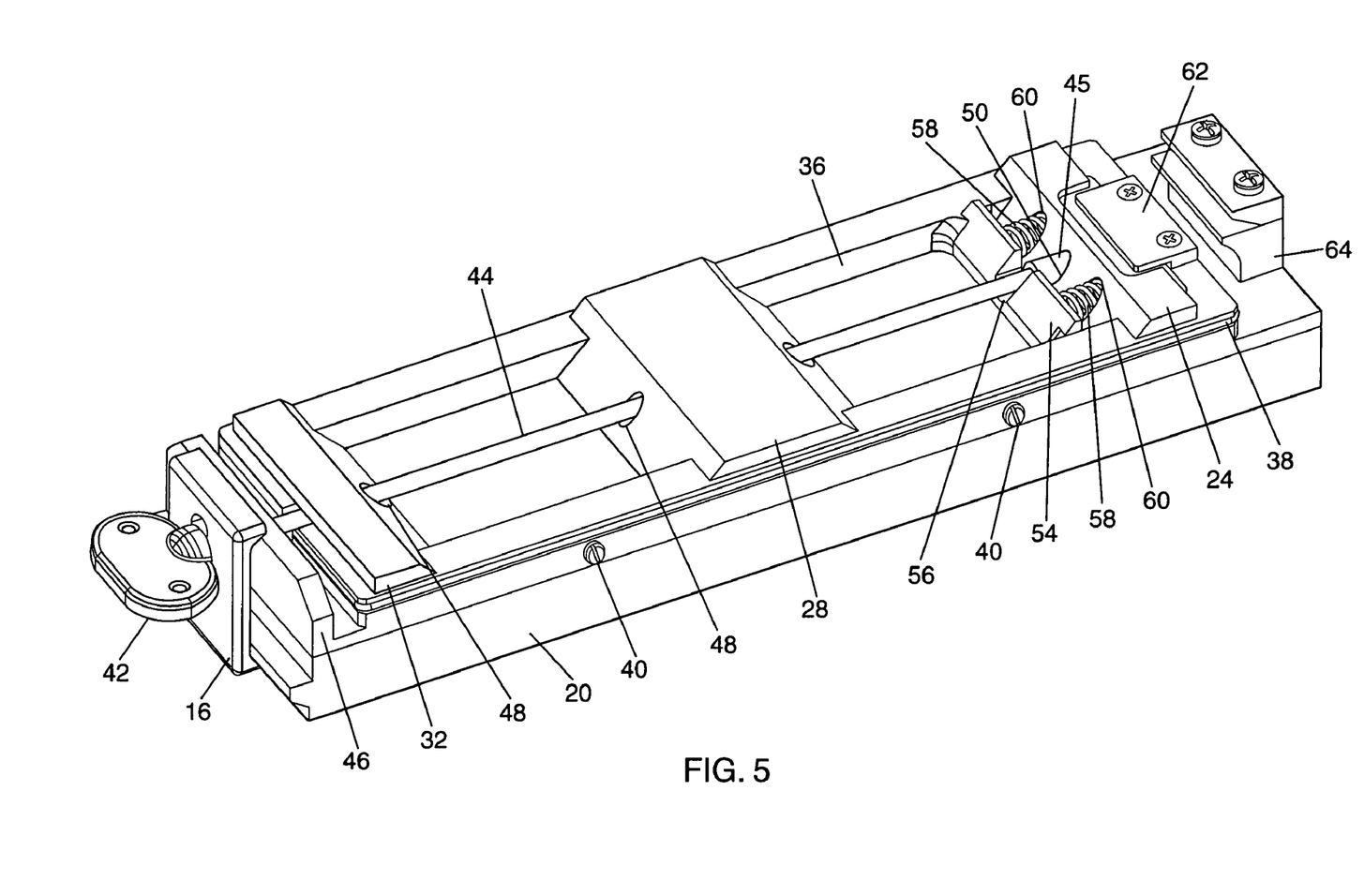
FIG. 5 is a view similar to FIG. 4 with two upper wedge blocks removed.
Figure 6:
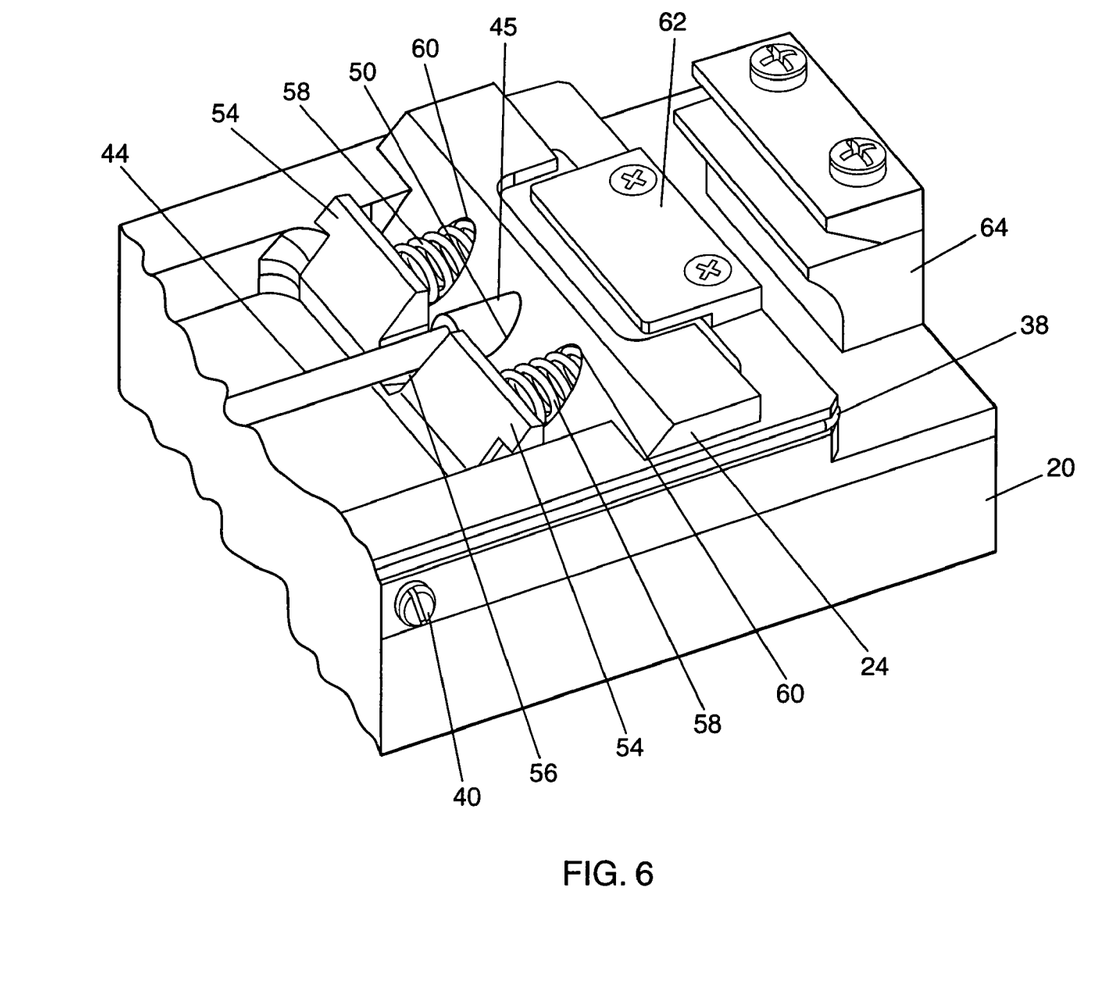
FIG. 6 is an enlarged view of the apparatus shown in FIG. 5 showing details in the vicinity of the rearmost wedge block.

FIG. 4 shows the wedge blocks 24, 26, 28, 30, 32 in the absence of the cover 34 and FIG. 5 is a view similar to FIG. 4 but with two upper wedge blocks removed. As shown, the base 20 is formed with a recessed channel 36 which functions to hold the wedge blocks from lateral movement and allows longitudinal front to back movement of the wedge blocks. Around the perimeter of the base 20 is an O-ring 38 which functions to provide a seal for the cover 34. The cover 34 is held loosely in place by the screws 40. Although not shown, the cover 34 is formed with slotted openings, elongated in the vertical direction, which allow the screws 40 to pass therethrough and allow the cover 34 to "float" so as to follow the vertical movement of the wedge blocks 24, 26, 28, 30, 32.

Each of the wedge blocks 24, 26, 28, 30, 32 has substantially planar upper and lower surfaces and substantially planar sloping side surfaces. Thus, the central wedge blocks 26, 28, 30 are trapezoidal in shape when viewed from their ends, while the end wedge blocks 24 and 32 look like half trapezoids when viewed from their ends. The sloping sides of all the wedge blocks are at the same predetermined acute angle to the base side of their respective trapezoid so that alternate wedge blocks can be inverted and have their adjacent sloping side surfaces parallel to each other. Preferably, the predetermined acute angle is in the range from about 30 degrees to about 60 degrees, and illustratively is 45 degrees.

The clamp mechanism 16 includes an enlarged head 42 suitable for gripping. The head 42 is securely connected to a rod 44 which has external threads on its distal end 45. The rod 44 extends through an opening in a first wall (or abutment) 46 of the base 20 and through aligned enlarged openings 48 of the wedge blocks 32, 30, 28, 26 (see FIG. 5). The enlarged openings 48 allow the wedge blocks 32, 30, 28, 26 to move vertically, as will be described hereinafter. The threaded end 45 of the rod 44 extends into an internally threaded opening 50 of the wedge block 24 and engages those internal threads. A shoulder 52 (see FIG. 7) on the rod 44 fits closely in the opening through the first wall 46 to ensure module structural integrity. The base 20 is formed with a second wall (or abutment) 54 adjacent to the sloping side surface of the wedge block 24. The second wall 54 is formed with a groove 56 to provide a passageway for the rod 44. A pair of coil springs 58 each has a first end bearing against the second wall 54 and a second end extending into a respective cavity 60 formed in the sloping side surface of the wedge block 24. The wedge block 26 is formed with a cavity extending into the block from its lower surface to accommodate the wall 54 and the springs 58. A retention clip 62 secured to the base 20 is provided to prevent upward movement of the wedge block 24.

In use, a module 14 is installed in an appropriate slot on the rack 10 and engages a respective connector 12. In addition, a retainer 64 may be provided to hold the lower rear corner of the module 14 as shown in FIG. 3, where the retainer 64 simulates the module 14 rearward retention attributed to the rack connector 12. With the cover 34 in place, the module 14 is easily slid into place. The clamp mechanism 16 is engaged with the lower front corner of the module 14 and the head 42 is turned clockwise to turn the rod 44. As the rod 44 turns, the threads at its distal end 45 turn and draw the wedge block 24 in the direction of the clamp mechanism 16, against the biasing force of the springs 58. As the wedge block 24 moves toward the clamp mechanism 16, it contacts the wedge block 26 and moves the wedge block 26 toward the wedge block 28. The wedge block 26 in turn contacts the wedge block 28 and moves the wedge block 28 toward the wedge block 30. The wedge block 28 in turn contacts the wedge block 30 and moves the wedge block 30 toward the wedge block 32. Since the wedge block 32 cannot move toward the clamp mechanism 16, after the wedge block 30 contacts the wedge block 32 further turning of the rod 42 causes the wedge blocks 26 and 30 to move upwardly, moving the cover 34 against the lower surface of the module 14. At this point, the wedge blocks 26 and 30 cannot move further upwardly and the rod 42 cannot be turned anymore. The module 14 is then securely clamped to the rack 10 with there being a thermally conductive path from the lower surface of the module 14, through the cover 34, through the wedge blocks 26 and 30, through the wedge blocks 24, 28 and 32, and to the base 20, thereby eliminating any gap between the module and the base and providing an uninterrupted thermal path.

When it desired to remove the module 14 from the rack 10, the head 42 is gripped and turned counterclockwise. This releases the compressive forces on the wedge blocks 24, 26, 28, 30, 32. The springs 58 move the wedge block 24 away from the clamp mechanism 16. This allows the wedge blocks 28 and 30 to drop and allows easy removal of the module 14 from its slot in the rack 10.

In the exemplary construction described herein, five wedge blocks have been illustrated. This number of wedge blocks is not considered to be limiting for the present invention. The present invention contemplates that there be an appropriate number of alternating wedge blocks so that compression thereof causes alternate ones to be biased up or down so as to insure good thermal contact with both the module and the base, as well as between adjacent wedge blocks.

Accordingly, there has been disclosed apparatus which is capable of providing efficient cooling of rack mounted electronic modules while accommodating relatively large tolerances in the mounting of the modules. While an illustrative embodiment of the present invention has been disclosed, it will be apparent to those of skill in the art that various adaptations and modifications of the described embodiment are possible. It is therefore intended that this invention be limited only by the scope of the appended claims.

What is claimed is:

1. Cold plate cooling apparatus for a rack mounted electronic module having a substantially planar lower surface, comprising:
    a cold plate having a substantially planar upper surface;
    a first thermally conductive block having a substantially planar lower surface adapted for heat transferring contact with said cold plate upper surface and a substantially planar side surface extending upwardly from said first block lower surface at a predetermined acute angle;
    a second thermally conductive block having a substantially planar lower surface adapted for heat transferring contact with said cold plate upper surface and a substantially planar side surface extending upwardly from said second block lower surface at said predetermined acute angle, wherein said second block side surface faces and is spaced from said first block side surface;

a third thermally conductive block having a substantially planar upper surface adapted for heat transferring contact with said module lower surface, a first substantially planar side surface extending downwardly from said third block upper surface from a first line at said predetermined acute angle to said third block upper surface, and a second substantially planar side surface extending downwardly from said third block upper surface from a second line at said predetermined acute angle to said third block upper surface, wherein said first line is parallel to said second line and wherein said third block is positioned between said first and second blocks with said third block first side surface parallel to said first block side surface and said third block second side surface parallel to said second block side surface; and means for applying a force to move said first block toward said second block so as to force said first and second block side surfaces into heat transferring contact with said third block first and second side surfaces, respectively, force said third block upwardly so that said third block upper surface is in heat transferring contact with said module lower surface, and force said first and second blocks downwardly so that said first and second block lower surfaces are in heat transferring contact with said cold plate upper surface.

2. The apparatus according to claim 1 further comprising a smooth flat thermally conductive cover positioned over said blocks.

3. The apparatus according to claim 1 wherein:

said first block is formed with an internally threaded opening extending into said first block from said first block side surface;

said second and third blocks are each formed with a respective through-bore which are alignable with each other and with said first block opening;

said force applying means includes a rod member threaded at a first end and extending through the aligned through-bores; and said first end of said rod member threadedly engages said internal threads of said first block opening.

4. The apparatus according to claim 3 wherein said cold plate includes guide means for limiting horizontal movement of said blocks to movement parallel to said rod member.

5. The apparatus according to claim 3 further comprising a clip secured to said cold plate and extending over said first block to prevent vertical movement of said first block.

6. The apparatus according to claim 3 wherein:

said cold plate is formed with an abutment having a through-bore, wherein said blocks are all on the same side of said abutment with said second block being the closest block to said abutment;

said rod member extends through said abutment through-bore; and said rod member is terminated at a second end beyond said abutment from said first block with an enlarged head adapted to be gripped for turning said rod member.

7. The apparatus according to claim 1 further comprising:

an abutment on said cold plate adjacent said first block side surface; and means for applying a biasing force to yieldably bias said first block away from said abutment.

8. The apparatus according to claim 7 wherein said biasing force applying means comprises a spring extending between said abutment and said first block.

9. The apparatus according to claim 1 wherein said predetermined acute angle is in the range from about 30 degrees to about 60 degrees.

10. The apparatus according to claim 9 wherein said predetermined acute angle is 45 degrees.

11. Cold plate cooling apparatus for a rack mounted electronic module having a substantially planar lower surface, comprising:

a cold plate having a substantially planar upper surface;

a first thermally conductive block having a substantially planar lower surface adapted for heat transferring contact with said cold plate upper surface and a substantially planar side surface extending upwardly from said first block lower surface at a predetermined acute angle;

a second thermally conductive block having a substantially planar lower surface adapted for heat transferring contact with said cold plate upper surface and a substantially planar side surface extending upwardly from said second block lower surface at said predetermined acute angle, wherein said second block side surface faces and is spaced from said first block side surface;

at least two third thermally conductive blocks each having a substantially planar upper surface adapted for heat transferring contact with said module lower surface, a first substantially planar side surface extending downwardly from said third block upper surface from a first line at said predetermined acute angle to said third block upper surface, and a second substantially planar side surface extending downwardly from said third block upper surface from a second line at said predetermined acute angle to said third block upper surface, wherein said first line is parallel to said second line and wherein said third blocks are positioned between said first and second blocks with said third block first side surfaces parallel to said first block side surface and said third block second side surfaces parallel to said second block side surface;

at least one fourth thermally conductive block each having a substantially planar lower surface adapted for heat transferring contact with said cold plate upper surface, a first substantially planar side surface extending upwardly from said fourth block lower surface from a first line at said predetermined acute angle to said fourth block lower surface, and a second substantially planar side surface extending upwardly from said fourth block lower surface from a second line at said predetermined acute angle to said fourth block lower surface, wherein said first line is parallel to said second line and wherein each of said fourth blocks is positioned between a respective pair of third blocks with each fourth block first side surface being parallel to an adjacent third block second side surface and each fourth block second side surface being parallel to an adjacent third block first side surface, and wherein there is one fewer fourth block than there are third blocks; and means for applying a force to move said first block toward said second block so as to force said block side surfaces into heat transferring contact with adjacent block side surfaces, force said third blocks upwardly so that said third block upper surfaces are in heat transferring contact with said module lower surface, and force said first, second and fourth blocks downwardly so that said first, second and fourth block lower surfaces are in heat transferring contact with said cold plate upper surface.

12. The apparatus according to claim 11 further comprising a smooth flat thermally conductive cover positioned over said blocks.

13. The apparatus according to claim 11 wherein:
said first block is formed with an internally threaded opening extending into said first block from said first block side surface;
said second, third and fourth blocks are each formed with a respective through-bore which are alignable with each other and with said first block opening;
said force applying means includes a rod member threaded at a first end and extending through the aligned through-bores; and
said first end of said rod member threadedly engages said internal threads of said first block opening.

14. The apparatus according to claim 13 wherein said cold plate includes guide means for limiting horizontal movement of said blocks to movement parallel to said rod member.

15. The apparatus according to claim 13 further comprising a clip secured to said cold plate and extending over said first block to prevent said first block from separating from said cold plate.

16. The apparatus according to claim 15 wherein:
said cold plate is formed with an abutment having a through-bore, wherein said blocks are all on the same side of said abutment with said second block being the closest block to said abutment;
said rod member extends through said abutment through-bore; and
said rod member is terminated at a second end beyond said abutment from said second block with an enlarged head adapted to be gripped for turning said rod member.

17. The apparatus according to claim 11 further comprising:
an abutment on said cold plate adjacent said first block side surface; and
means for applying a biasing force to yieldably bias said first block away from said abutment.

18. The apparatus according to claim 17 wherein said biasing force applying means comprises a spring extending between said abutment and said first block.

19. The apparatus according to claim 11 wherein said predetermined acute angle is in the range from about 30 degrees to about 60 degrees.

20. The apparatus according to claim 19 wherein said predetermined acute angle is 45 degrees.

* * * * *